(12) United States Patent
Siniaguine et al.

(10) Patent No.: US 6,287,976 B1
(45) Date of Patent: Sep. 11, 2001

(54) PLASMA PROCESSING METHODS AND APPARATUS

(75) Inventors: Oleg Siniaguine, San Jose; Igor Bagriy, Sunnyvale, both of CA (US)

(73) Assignee: Tru-Si Technologies, Inc., Sunnyvale, CA (US)

( * ) Notice: Subject to any disclaimer, the term of this patent is extended or adjusted under 35 U.S.C. 154(b) by 0 days.

(21) Appl. No.: 09/315,122

(22) Filed: May 19, 1999

(51) Int. Cl.$^7$ .................................................. H01L 21/302
(52) U.S. Cl. ........................ 438/716; 216/67; 427/569
(58) Field of Search .................. 216/67; 427/481, 427/569; 438/716

(56) References Cited

U.S. PATENT DOCUMENTS

| | | | |
|---|---|---|---|
| 4,315,960 | 2/1982 | Ohji et al. | 427/248.1 |
| 4,416,760 | 11/1983 | Turner | 204/298 |
| 5,029,555 | 7/1991 | Dietrich et al. | 118/730 |
| 5,204,145 | * 4/1993 | Gasworth | 427/577 |
| 5,238,532 | 8/1993 | Zarowin et al. | 156/643 |
| 5,282,921 | 2/1994 | Poultney | 156/626 |
| 5,291,415 | 3/1994 | Zarowin et al. | 364/474.3 |
| 5,308,461 | 5/1994 | Ahonen | 204/192.11 |
| 5,312,510 | 5/1994 | Poultney | 156/345 |
| 5,365,031 | 11/1994 | Mumola | 219/121.43 |
| 5,558,909 | * 9/1996 | Poliquin et al. | 427/251 |
| 5,665,167 | 9/1997 | Deguchi et al. | 118/728 |
| 5,767,627 | 6/1998 | Siniaguine | 315/111.41 |
| 5,811,021 | 9/1998 | Zarowin et al. | 216/67 |
| 5,834,730 | * 11/1998 | Suzuki et al. | 219/121.43 |

FOREIGN PATENT DOCUMENTS

| | | |
|---|---|---|
| 0 807 964 A1 | 11/1997 | (EP) . |
| 59-112624 A | * 6/1984 | (JP) . |
| 60-24018 A | * 2/1985 | (JP) . |
| 3-284839 A | * 12/1991 | (JP) . |
| WO 92/12273 | 7/1992 | (WO) . |
| WO 92/12610 | 7/1992 | (WO) . |
| WO 96/21943 | 7/1996 | (WO) . |
| WO 96/32742 | 10/1996 | (WO) ........................ H01L/21/3065 |
| WO 97/45856 | 12/1997 | (WO) . |
| WO 97/45857 | 12/1997 | (WO) ............................ H01J/37/32 |
| WO 98/19337 | 5/1998 | (WO) . |
| WO 99/26796 | 6/1999 | (WO) ............................ B44C/1/22 |

OTHER PUBLICATIONS

Lieberman, Michael A. et al., "Principles of Plasma Discharges and Materials Processing" (John Wiley & Sons, New York, 1994), p. 1.
Agrikov et al., "Dynamic Plasma Treatment of HIC (Hybrid Integrated Circuit) Substrates", Elektronnaya Tehnika, Ser, 10, 5(71), 1988, pp. 30–32, with partial translation.

* cited by examiner

Primary Examiner—Randy Gulakowski
Assistant Examiner—Jiri Smetana
(74) Attorney, Agent, or Firm—Skjerven Morrill MacPherson, LLP; Michael Shenker

(57) ABSTRACT

To move an article in and out of plasma during plasma processing, the article is rotated by a first drive around a first axis, and the first drive is itself rotated by a second drive, so that the article enters the plasma at different angles for different positions of the first axis. The plasma cross-section at the level at which the plasma contacts the article is such that those points on the article that move at a greater linear velocity (due to being farther from the first axis) move longer distances through the plasma. As a result, the plasma processing time becomes more uniform for different points on the article surface. The direction of rotation of the first and/or second drive changes during processing to improve processing uniformity. The article is allowed to be processed with the plasma only during one-half of each revolution of the second drive. In the other half of each revolution, the processing is substantially prevented by increasing the second drive velocity as the article is carried through the plasma.

11 Claims, 13 Drawing Sheets

PLASMA PROCESSING METHODS AND APPARATUS

CROSS-REFERENCE TO RELATED APPLICATIONS

Not Applicable.

STATEMENT REGARDING FEDERALLY SPONSORED RESEARCH

Not Applicable.

BACKGROUND OF THE INVENTION

The present invention relates to processing of materials, and more particularly to plasma processing.

Plasma processing is widely used to modify surface properties of materials. Thus, plasma is used in fabrication of integrated circuits to perform deposition, etch, cleaning, and rapid thermal anneal. Plasma-based surface processes are also used for hardening of surgical instruments and machine tools, and are used in aerospace, automotive, steel, biomedical, and toxic waste management industries. See, for example, M. A. Lieberman and A. J. Lichtenberg, "Principles of Plasma Discharges and Materials Processing" (1994), page 1.

A common goal in a plasma-based process design is uniform treatment of the target surface (i.e. the surface treated with plasma). It is desirable to develop systems in which the uniform processing is facilitated.

In some systems, the target article and the plasma move relative to each other, and it is desirable to facilitate precise control of this relative movement. Further, it is desirable to reduce stresses on the target articles thus reducing the possibility of damaging the target articles.

SUMMARY

Some embodiments of the present invention provide methods and apparatus for moving the target articles relative to the plasma so as to facilitate uniform processing of the target surfaces. In particular, some embodiments facilitate precise control of the movement of the articles relative to the plasma by reducing accelerations of the articles. Reducing the accelerations also results in reduction of stresses to which the articles are subjected.

As the target article moves through the plasma, the article velocity may have to be varied to achieve uniform plasma processing. Consider, for example, the dynamic plasma treatment (DPT) system described in Yu. M. Agrikov et al., "Dynamic Plasma Treatment of HIC (Hybrid Integrated Circuit) Substrates", Elektronnaya Tehnika, Ser. 10, 5(71), 1988, pages 30–32, incorporated herein by reference. In that system, a target substrate is moved in and out of the plasma in a chamber maintained at atmospheric pressure. The substrate is moved by a horizontal arm rotating in a horizontal plane. The plasma flows vertically, intersecting the substrate path. The horizontal cross-section of the plasma is smaller than the substrate surface being treated. Therefore, the plasma source moves along the rotation radius to process the whole surface.

Since the substrate points that are located farther from the rotation axis move faster than the points closer to the rotation axis, the points farther from the rotation axis could be exposed to the plasma for less time than the points closer to the axis, resulting in non-uniform processing. One solution to this problem is to vary the angular velocity of the substrate as the plasma source moves along the rotation radius. Thus, when the plasma source is farther from the rotation axis, the angular velocity can be decreased to increase the time that the substrate moves through the plasma.

Another solution is to vary the velocity of the plasma source.

Both solutions need improvement. Thus, varying the angular velocity of the substrate leads to accelerations that make precise control of the angular velocity more difficult to achieve. Further, these accelerations create stresses that may damage the substrate if the substrate is fragile, for example, if the substrate is a semiconductor wafer. Therefore, for this solution, it is desirable to reduce variations of the substrate angular velocity.

Varying the velocity of the plasma source is disadvantageous because accelerations experienced by the plasma relative to immobile ambient gas can change the plasma characteristics and hence make the processing less uniform. Of note, if the processing occurs at atmospheric pressure (as does DPT), even constant-velocity movement of the plasma source can make the plasma difficult to control unless the plasma motion is very slow. Thus, it is desirable to reduce the velocity and acceleration of the plasma source, preferable down to zero.

Accordingly, in some embodiments of the present invention, target surface points that move at different velocities are caused to travel different distances through the plasma so that the faster moving points travel a longer distance. As a result, the time spent in the plasma by faster moving points approaches the time spent by slower moving points. Consequently, the accelerations needed to make the plasma processing uniform are reduced.

In some embodiments, the plasma source is stationary.

In some embodiments, these advantages are achieved as follows. The plasma flow cross-section through which the target article moves is made to have different dimensions in different directions. The target article passes through the plasma multiple times in different directions so that the points moving faster intersect the plasma along a longer dimension of the cross-section than the slower moving points. As a result, uniform treatment can be obtained with less variation of the article velocity.

In some embodiments, the plasma source is stationary. Changing the direction in which the target article intersects the plasma is achieved by rotating the drive that rotates the article so that the article rotates around a first axis which itself rotates around a second axis. The directions change because the article intersects the plasma at different positions of the first axis.

In some embodiments, the article rotates, and the direction of rotation is changed during processing. When plasma processing takes place at a high pressure (for example, atmospheric pressure), plasma becomes unstable when the article enters the plasma. As a result, the article edge points that enter the plasma are processed at a lower rate than the rest of the article. Changing the direction of the rotation helps compensate for this non-uniformity. In some embodiments, the article rotates around a first axis, and the first axis rotates around a second axis. Either the rotation around the first axis or the rotation around the second axis, or both, can change direction.

In some embodiments, the article rotates around the first axis and the first axis rotates around the second axis. During one half of each revolution around the second axis, the article is processed with the plasma. During the other half of each revolution around the second axis, plasma processing of the article is substantially prevented. In some embodiments, the processing is substantially prevented by increasing the velocity of the article to cause the article to move so quickly through the plasma that substantially no processing has time to occur. In some embodiments, this further improves processing uniformity by allowing different portions of the article to heat and cool more uniformly.

Other embodiments and variations are discussed below. The invention is defined by the appended claims.

DESCRIPTION OF PREFERRED EMBODIMENTS

Figure 1:
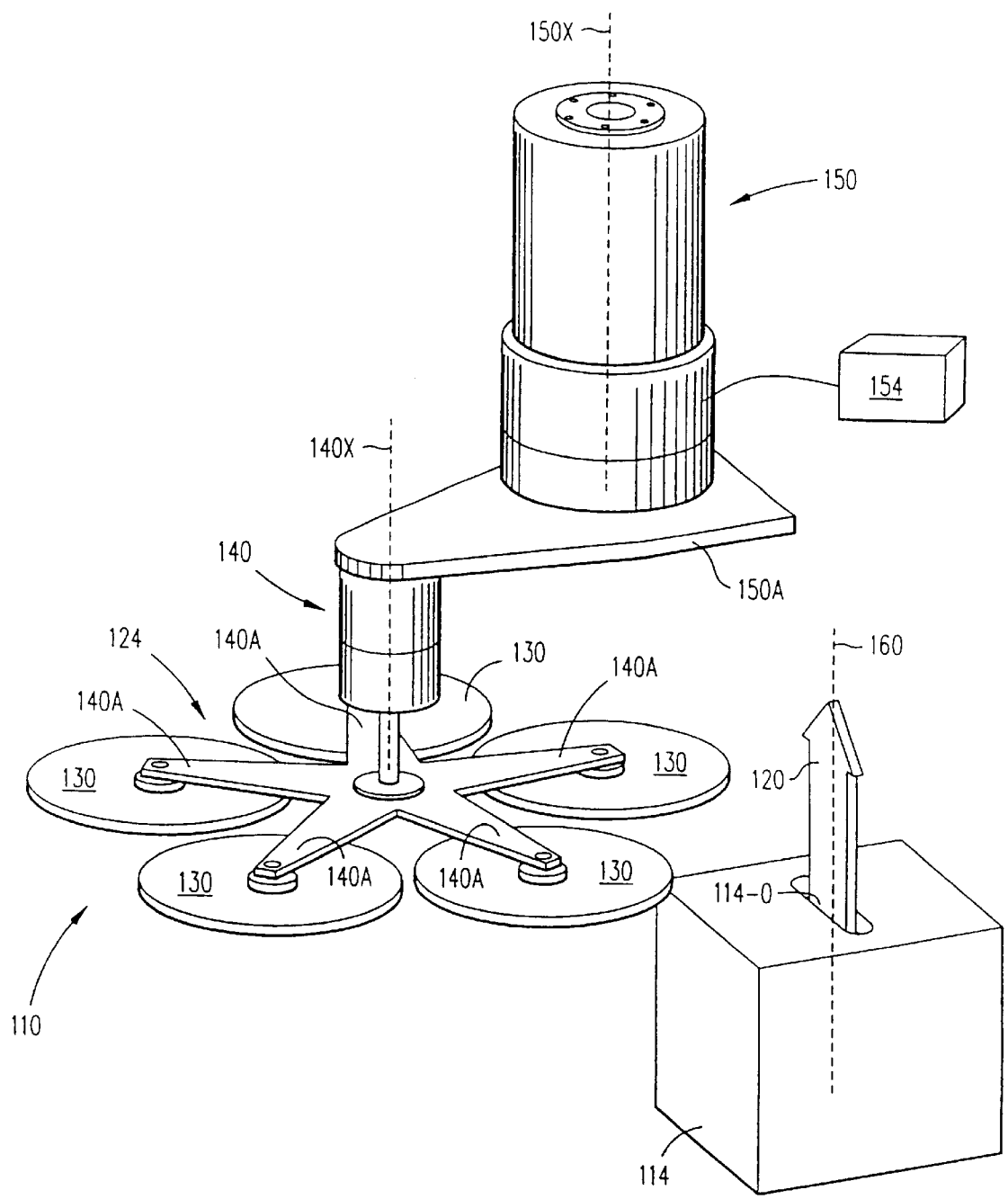
FIG. 1 is a perspective view of a plasma processing system according to the present invention.

In plasma processing system 110 (FIG. 1) plasma source 114 generates plasma jet 120 schematically shown by an arrow. Plasma jet 120 flows vertically upwards through an elongated opening 114-O in source 114. The opening 114-O is elliptical in some embodiments. Horizontal cross sections of plasma jet 120 are also elliptical. In some embodiments, the opening 114-O and the plasma horizontal cross sections have a shape of an elongated rectangle, perhaps with rounded corners.

Carrousel 124 includes five holders 130. Each holder 130 holds an article 134 (FIG. 2) whose bottom surface is processed by plasma jet 120. Articles 134 in FIGS. 1–5 are round semiconductor wafers whose flat horizontal bottom surfaces are processed with plasma 120. In some embodiments, the articles are not round and/or are not semiconductor articles. In some semiconductor-wafer embodiments, holders 130 are non-contact wafer holders such as described, for example, in PCT publication WO 96/21943 "Device For Treating Planar Elements With A Plasma Jet" published July 18, 1996 (inventors I. M. Tokmulin et al.) incorporated herein by reference. In some such embodiments, the plasma processing takes place at atmospheric pressure or at some other pressure close to the atmospheric pressure.

In some embodiments, wafer holders 130 hold the wafers by vacuum or by electrostatic, mechanical, or some other means.

Some embodiments of system 110 have only one older 130, or some other number of holders.

Each wafer holder 130 is attached to an arm 140A of a first angle drive 140. Angle drive 140 rotates the wafers around vertical axis 140X.

Angle drive 140 is attached to arm 150A of second angle drive 150. Drive 150 rotates around vertical axis 150X.

Control system 154 controls the drives 140 and 150 by conventional means (for example, using a computer).

Figure 2:
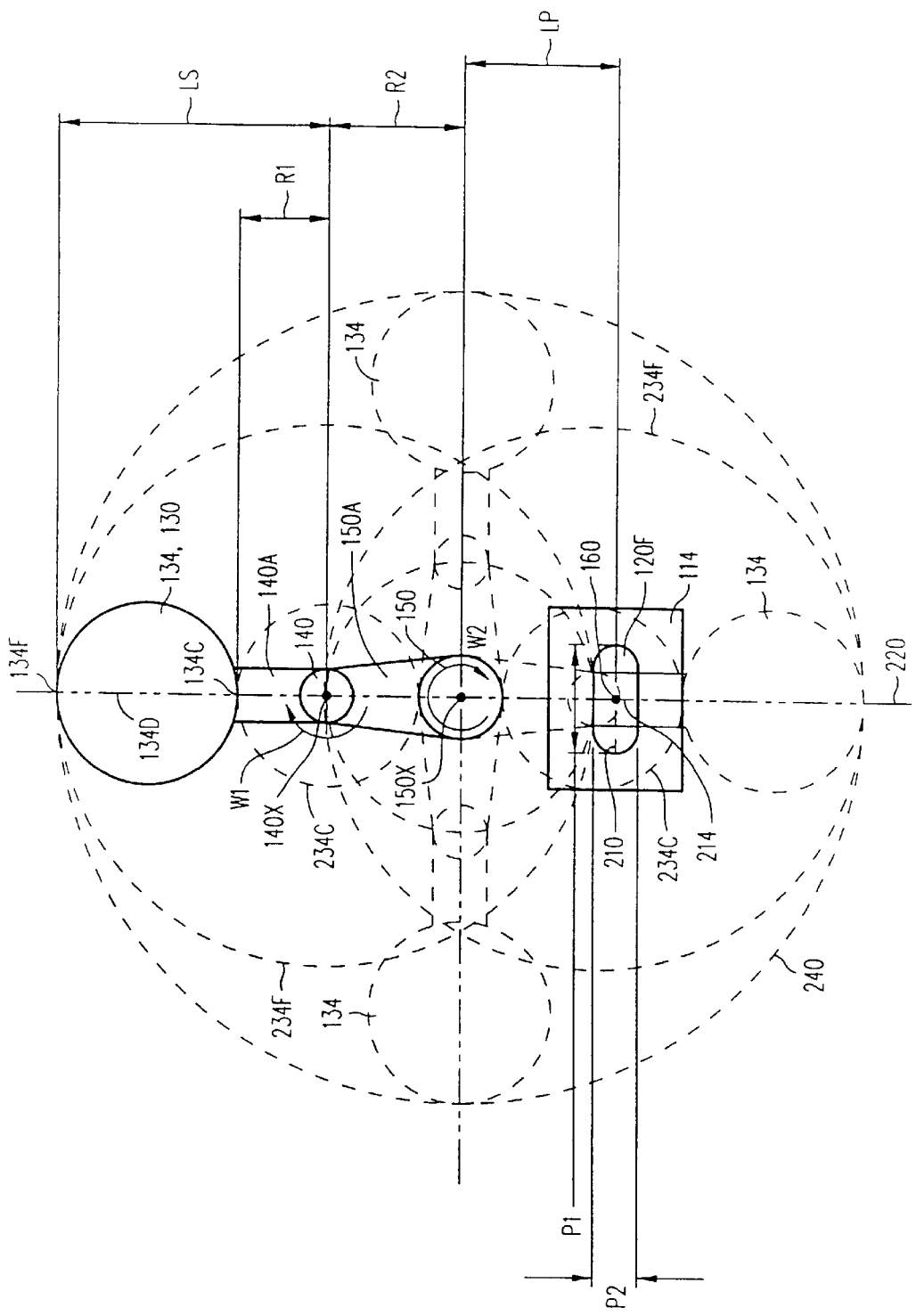
FIGS. 2–4 are top views illustrating wafer trajectories in the system of FIG. 1.
Figure 3:
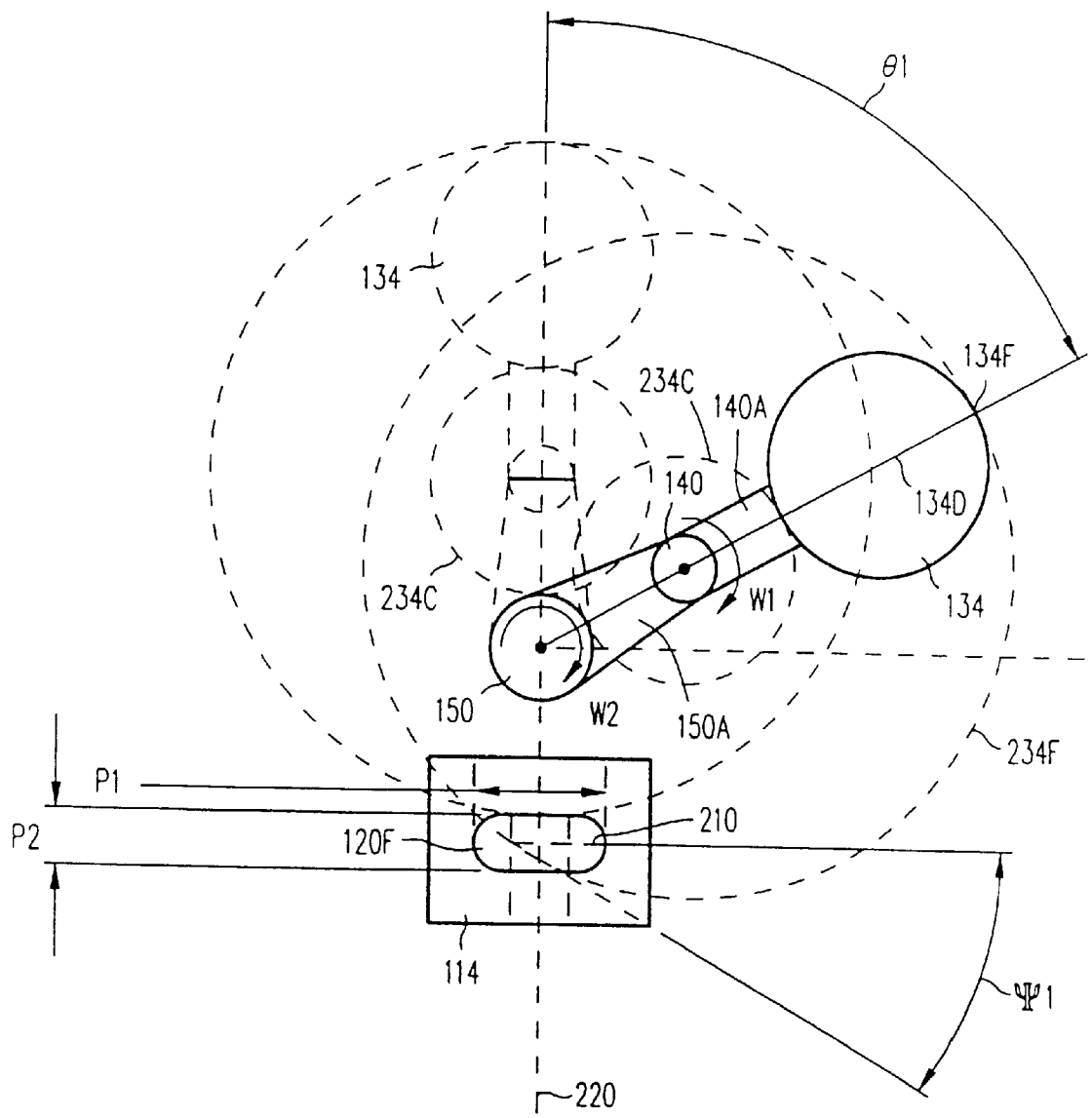
Figure 4:
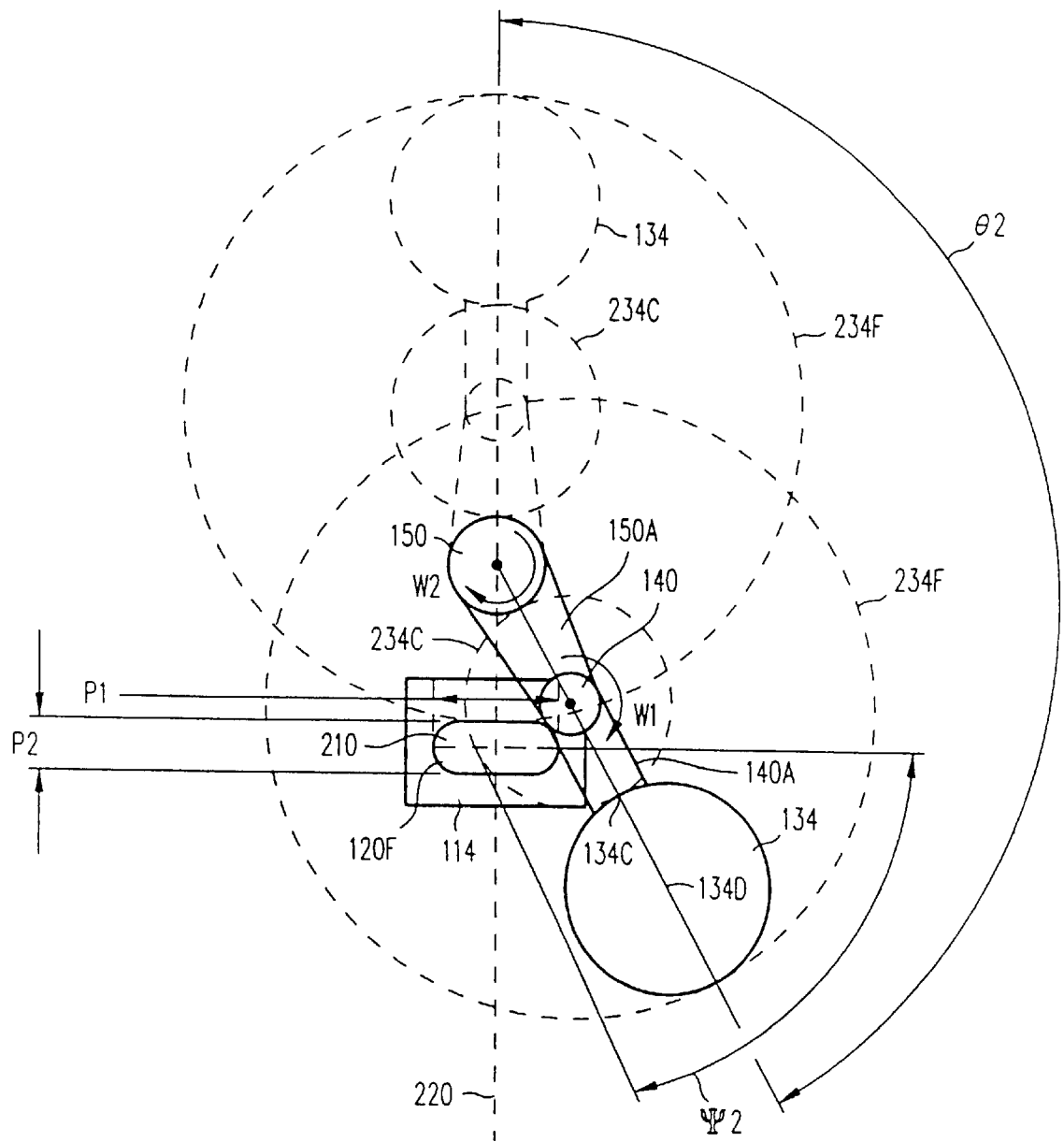

Top view FIGS. 2–4 show different positions of a single wafer 134 during processing.

In some embodiments, plasma source 114 does not move during processing, and therefore the plasma jet is stationary, that is, the plasma jet fills a substantially stationary region in space. However, the plasma source can move vertically and horizontally before processing in order to be positioned at a desired location relative to targets 134 (and, in particular, at a desired distance relative to the targets) as dictated by processing requirements.

Some embodiments of the plasma source are described in PCT application WO 98/31038 (published Jul. 16, 1998) entitled "Plasma Generation and Plasma Processing of Materials", incorporated herein by reference. See also PCT publications WO 92/12610 (published Jul. 23, 1992), WO 92/12273 (published Jul. 23, 1992), WO 96/21943 (published Jul. 18, 1996), which are incorporated herein by reference.

In some embodiments, the angular velocity W1 of drive 140 is constant and thus is simple to control. Angular velocity W2 of drive 150 is considerably smaller than W1. In some embodiments, the average angular velocity of drive 150 is ten times smaller than the velocity W1. Therefore, wafers 134 cross the plasma jet multiple times during each revolution of drive 150.

In some embodiments, system 110 is used for dynamic plasma treatment performed at atmospheric pressure such as described, for example, in Yu. M. Agrikov et al., cited above, incorporated herein by reference. The angular velocities W1 and W2 are controlled so that the linear velocities of points being treated with plasma are greater than the speed at which the heat from the plasma propagates through article 130. Consequently, the processing conditions approach the conditions that would exist if the entire target surface were simultaneously exposed to the plasma. In some embodiments described, W1 is a constant velocity of about 5 to 30 revolutions per second, and W2 is much smaller, the average value of W2 being at least 10 times smaller than W1 in some embodiments.

Dynamic plasma treatment is also described in the following articles incorporated herein by reference: P. P. Kulik, "Dynamic Plasma Treatment (DPT) of a Surface of a Solid Body", Plazmohimiya-87, Part 2 (U.S.S.R. Academy of Science, Institut Neftehimicheskogo Sinteza im. A. V. Topchieva, Moscow, 1987), pages 4–13; Yu. M. Agrikov et al., "Foundations of a Realization of a Method of Dynamic Plasma Treatment of a Surface of a Solid Body" (same publication, pages 58–96.)

In some embodiments the plasma processing is performed in vacuum.

FIGS. 1–4 use the following notation:

Numeral 160 denotes a vertical axis that passes through the center of the opening 114-O and plasma jet 120. Axis 160 is a symmetry axis of the opening 114-O, the plasma jet 120, and plasma source 114.

R1 is the distance between axis 140X and the nearest edge point 134C of wafer 134 (all the distances in FIGS. 2–4 are taken between the parallel projections of respective points onto a horizontal plane unless mentioned otherwise).

LS is the distance between the axis 140X and the farthest edge point 134F of wafer 134.

R2 is the distance between the axes 140X and 150X.

LP is the distance between axis 150X and axis 160 of plasma jet 120.

120F denotes the horizontal cross section of plasma jet 120 at the level of the lower surface of wafer 134. This cross section is called a "plasma footprint" below. The long axis of this elliptical footprint is shown at 210; the short axis is shown at 214. Axis 214 is perpendicular to axis 210.

Short axis 214 lies on axis 220 which intersects the axes 160, 150X in the top view of FIGS. 2–4.

P1 is the length of footprint 120F, and P2 is the width of the footprint.

In FIGS. 2–4, each circle 234C is a trajectory of the wafer point 134C for some position of the axis 140X. Each circle 234F is a trajectory of point 134F for some position of axis 140X. The actual trajectories of points 134C and 134F are not circles because the axis 140X rotates during processing. However, in embodiments in which the angular velocity W2 of drive 150 is small relative to the angular velocity W1 of drive 140, circles 234C, 234F are fair approximations of the actual trajectories of points 134C, 134F.

In FIG. 2, circle 240 is the smallest circle circumscribed around all the circles 234F.

Angles Θ (Θ1 in FIG. 3 and Θ2 in FIG. 4) are angles between the axis 220 and arm 150A (that is, between axis 220 and a horizontal straight line intersecting the vertical axes 150X and 140X). In FIG. 2, Θ=0. Angles Ψ (Ψ1 in FIG. 3, Ψ2 in FIG. 4) are angles between (1) the long axis 210 of plasma footprint 120F and (2) the trajectory of a selected point on wafer 134 where this trajectory intersects the axis 210. The selected point is chosen on the diameter 134D interconnecting the points 134C and 134F. In FIG. 3 (Θ=Θ1), this selected point is 134F. In FIG. 4, the selected point is 134C. Different wafer points are selected for different angles Θ because no single wafer point intersects the plasma footprint at every value of Θ. Of note, in some embodiments, the wafer diameter is 100–300 mm; the length P1 of the footprint 120F is 50–150 mm; the footprint width P2 is 20–50 mm; R1 is about 20–100 mm; R2 is 150–300 mm; LS is 120–400 mm; LP is 150–300 mm.

The trajectory determining the angle Ψ is drawn assuming the arm 150A is stationary. The drawn trajectory is a good approximation of the actual trajectory if the angular velocity W2 of drive 150 is small relative to velocity W1 of drive 140.

In FIG. 2, wafer 134 does not intersect plasma footprint 120F.

Figure 5:
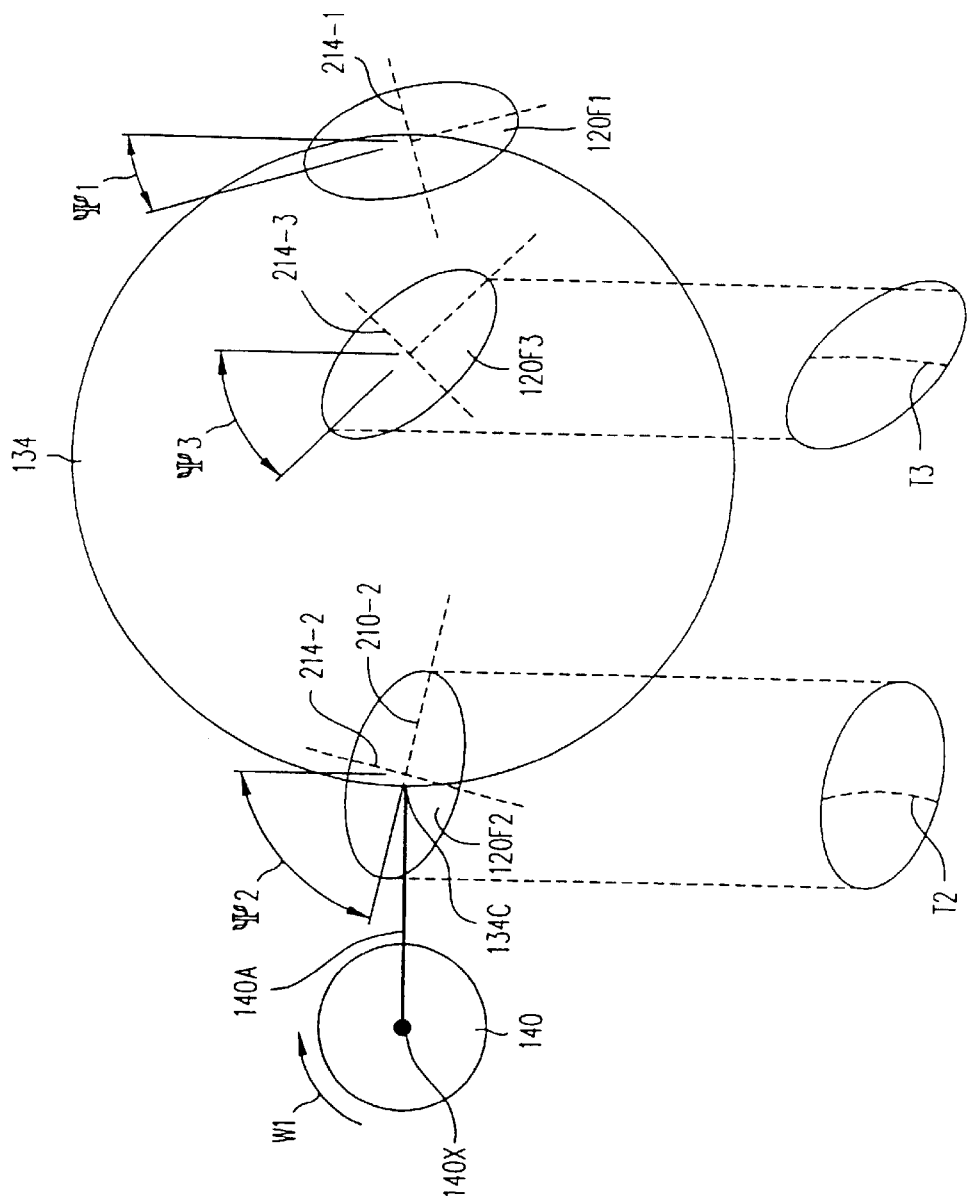
FIG. 5 is a top view illustrating different positions of plasma relative to a wafer in the system of FIG. 1.

As illustrated in FIGS. 2–5, as the arm 150A approaches plasma jet 120 (the angle Θ increases), the intersection of plasma footprint 120F with the wafer 134 approaches the point 134C and axis 140X. In FIG. 5, the ellipse 120F1 shows the position of plasma footprint 120F relative to wafer 134 when Θ=Θ1 (FIG. 3). In that position, the plasma footprint covers the point 134F. The ellipse 120F2 shows the plasma footprint position at Θ=Θ2 (FIG. 4). In that position, plasma footprint 120F covers the point 134C. Ellipse 120F3 shows the position of the plasma footprint 120F when Θ has an intermediate value between Θ1 and Θ2.

As the plasma footprint moves closer to point 134C and to axis 140X, the plasma processes wafer points having lower linear velocities. Indeed, the linear velocity relative to axis 140X (corresponding to the angular velocity W1) decreases because the distance from axis 140X decreases. Since angular velocity W1 is considerably higher than W2, the linear velocity component corresponding to W1 dominates the point's resultant linear velocity. In addition, as the angle Θ increases (see FIGS. 2–4), the angle between the vector of the linear velocity relative to axis 140X and the linear velocity of axis 140X relative to axis 150X increases for points passing through the plasma. The increasing angle tends to further reduce the magnitude of the resultant linear velocity.

The decreasing linear velocity tends to increase the plasma processing time for points closer to the point 134C. However, the decreasing linear velocity is at least partially offset by the decreasing length of the points' trajectories through the plasma footprint. For example, the trajectory T2 of point 134C through ellipse 120F2 is shorter than the trajectory T3 of the point passing through the center of ellipse 120F3. The trajectory length decreases because the plasma footprint turns relative to the wafer so that as Θ increases from 0 to 180°, the angle between short axis 214 of the plasma footprint and the arm 140A increases from about 0 towards 90°. (In FIG. 5, the axis 214 is shown at 214-1, 214-2, 214-3 for respective plasma footprint positions 120F1, 120F2, 120F3. The long axis 210 in the position 120F2 is shown at 210-2.) Since the wafer points travel through the footprint essentially at 90° to arm 140A, their trajectories become shorter.

In some embodiments, the angular velocities W1 and W2 are chosen so that as Θ increases to 180°, each point on wafer 134 passes through footprint 120F several times during several successive revolutions of first drive 140. Thus, successive plasma paths on the wafer surface overlap. When Θ=0 or Θ=180°, wafer 134 does not pass through plasma 120. Therefore, points 134C and 134F pass through the plasma about the same number of times as every other wafer point.

To reduce the probability that different points may pass a different number of times through the plasma, in some embodiments each article 130 is processed in two or more revolutions of drive 150. In each revolution, the plasma traces a different path on the article surface, thus increasing the processing uniformity. To obtain different plasma paths in different revolutions, the following techniques are used:

I. After each revolution, the drive 150 is stopped for a while in the position Θ=0 (FIG. 2), while the drive 140 continues to rotate. Then drive 150 is restarted at a time when the position of wafer 130 is different from the wafer position at the start of a previous revolution. In some embodiments, the stopping time is a few milliseconds.

II. Alternatively, drive 150 is not stopped at Θ=0, but the velocity W2 is changed near Θ=0 compared with a previous revolution (for example, W2 is increased or decreased by 0.1% when Θ is near 0), so that when Θ increases to a value at which the wafer 130 starts intersecting the plasma 120, the wafer 130 has a different position from its position for the same Θ in a previous revolution. Such small variations of W2 can be performed with less acceleration of drive 150 than in option I. Further, since drive 150 is not stopped, the processing time is less than in option I. In some embodiments, for Θ near 0, W2 is increased for 2 or 3 revolutions of drive 150, then W2 is decreased for a few revolutions of drive 150, then increased again. In some embodiments, for Θ values at which the wafers 130 intersect the plasma, W2 is the same in each revolution.

III. Velocity W1 of drive 140 is varied slightly (for example, by 0.1%) between different revolutions of drive 150.

The technique III is combined with I or II in some embodiments.

In some variations of techniques I, II, III, W2 and/or W1 are varied when Θ is near 180° and/or 0° and/or some other value.

The technique I has the advantage of allowing the wafer 130 to cool at least part of the way down to its original temperature after each revolution of drive 150, thus allowing the thermal conditions to be similar at each revolution. See PCT Publication WO 96/21943 published Jul. 18, 1996, incorporated herein by reference. In some embodiments, the wafer is stopped for a few seconds at $\Theta=0$ to allow the wafer to cool. If the processing is sensitive to the thermal conditions, velocity W1 is controlled so that the wafer is allowed to cool during each revolution of drive 140.

In FIGS. 2–4, the following relations hold true:

$$R1 \geq P1/2 \qquad (1)$$

that is, the distance R1 between the axis 140X and the nearest edge point 134C of wafer 134 is greater than or equal to one half of the length P1 of plasma footprint 120F.

This condition ensures in any revolution of first drive 140, any given point on wafer 134 passes through plasma 120 at most once. This is true even if the axis 140X is close to the axis 160. If the relation (1) did not hold, and the axis 140X were close to plasma 120, some wafer points (for example, 134C) could pass through the plasma twice in a single revolution of drive 140. Other wafer points (such as 134F) would pass through plasma 120 at most once in any revolution of drive 140. Therefore, the plasma processing would be less uniform unless the wafer velocity were doubled for points that pass through the plasma twice during a single revolution of drive 140.

$$R2 \geq R1 \qquad (2)$$

that is, the distance between axes 140X and 150X (essentially the length of arm 150A) is greater than the distance between the axis 140X and wafer point 134C.

$$R2-R1 < LP < R2+R1 \qquad (3)$$

$$LP+R2 \leq LS \qquad (4)$$

The relations (2), (3), and (4) allow every point of wafer 134 to be processed during a single revolution of drive 150 provided the velocity W2 is sufficiently low relative to W1.

The appendix at the end of this description gives equations that can be used to determine the angular velocity W2. The equations assume that W1 is constant. The equations can be solved using known numerical methods.

Alternatively, W2 can be determined experimentally, for both constant and variable velocities W1, using known iterative techniques. More particularly, when system 110 is being set up, test wafers are processed at some angular velocity $W2_1$ which is the first iterative approximation of the final velocity W2. In some embodiments, velocity $W2_1$ is constant. Then the wafers are examined to determine which points were processed too little relative to other points. For example, if the plasma processing is an etch process, the amount $h_1(r)$ of the material etched at different wafer points is examined, where r is the distance between the wafer point and axis 140X. Suppose that it is desired to etch away the amount $h_0(r)$. (In many processes $h_0(r)$ is independent of r, that is, the same amount of material is to be etched away at every wafer point.) Then the velocity $W2_2(r)$ at the second iterative pass is given by the formula:

$$W2_2(r)=W2_1(r)*h1(r)/[h0(r)31\ h1(r)].$$

If additional iterations are desired, the velocity W2 at each subsequent iteration can be determined similarly (the more material is removed at a given coordinate r during the previous iteration, the greater is the velocity W2(r) during the next iteration).

These iterations are programmed into the control system 154. In production, the control system 154 causes the system 110 to perform all the iterations.

Figure 6:
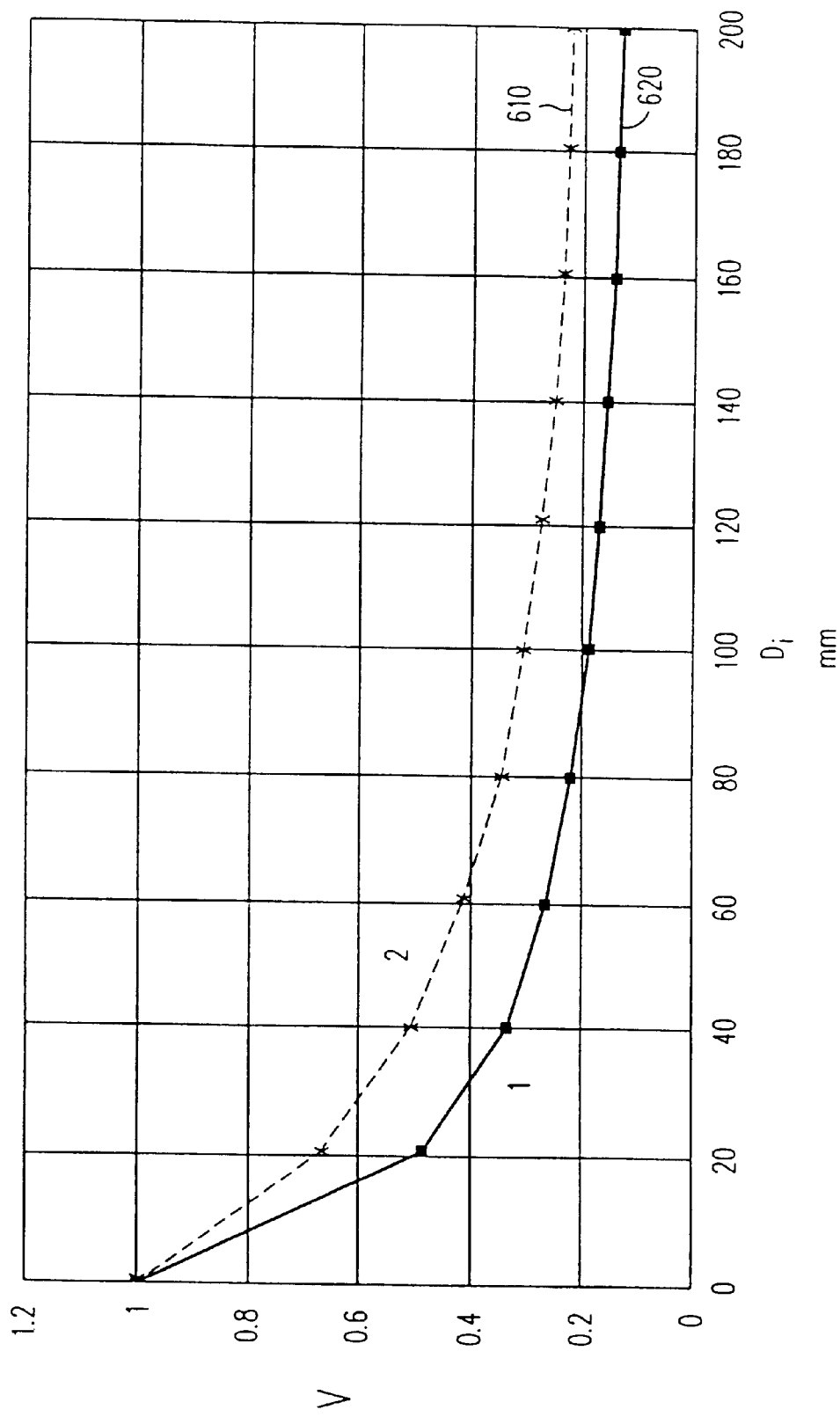
FIG. 6 shows velocity graphs for the system of FIG. 1 and for a prior art system.

Because wafer points traveling at a greater linear velocity tend to have longer trajectories through the plasma footprint 120F (see FIG. 5), uniform plasma processing can be achieved with less variation of the angular velocity W2 of drive 150. FIG. 6 illustrates this in one embodiment for a 200 mm wafer. The horizontal axis $D_i$ is the distance between a wafer point P on diameter 134D and the point 134C. The top curve 610 shows the linear velocity V of the center of plasma footprint 120F (axis 160) relative to axis 140X. The velocity units are chosen so that V=1 at $D_i=0$. The velocity V was determined from velocity W2 which in turn was determined from the equations in the appendix.

The bottom curve 620 in FIG. 6 shows the linear velocity V for a prior art apparatus having only the angle drive 150. The first drive 140 is omitted. In that prior art apparatus, the distance between the axis 150X and the nearest wafer point 134C is R2+R1 where R2 and R1 are the dimensions for which the curve 610 was obtained. The linear velocity V was determined from angular velocity W2 which in turn was computed from appropriate equations similar to those given in the appendix. Curves 610 and 620 intersect at $D_i=0$, but the slope magnitude (and hence the acceleration) for curve 610 is smaller than for curve 620. The maximum acceleration (at $D_i=0$) for curve 610 is about two times smaller than for curve 620. Since the angular velocity W2 is proportional to V, the acceleration associated with W2 is also about two times smaller for curve 610.

In some embodiments, the plasma system 110 corresponding to curve 610 performs a back-side etch of wafers or individual dies to reduce the wafer or die thickness to 15–350 $\mu$m after the circuits on the wafers or the dies have been fabricated. Such thin dies and wafers are suitable for vertical integration modules in which multiple dies are stacked on top of each other and then the whole stack is packaged. See PCT patent application WO 98/19337 "Integrated Circuits and Methods for Their Fabrication" published May 7, 1998 and incorporated herein by reference. The thin wafers and dies are fragile, and reducing the acceleration in the plasma processing system reduces the possibility of damaging the wafers and dies and thus increases the yield.

In some embodiments, each holder 130 holds an individual die or some other article rather than a wafer.

Figure 7:
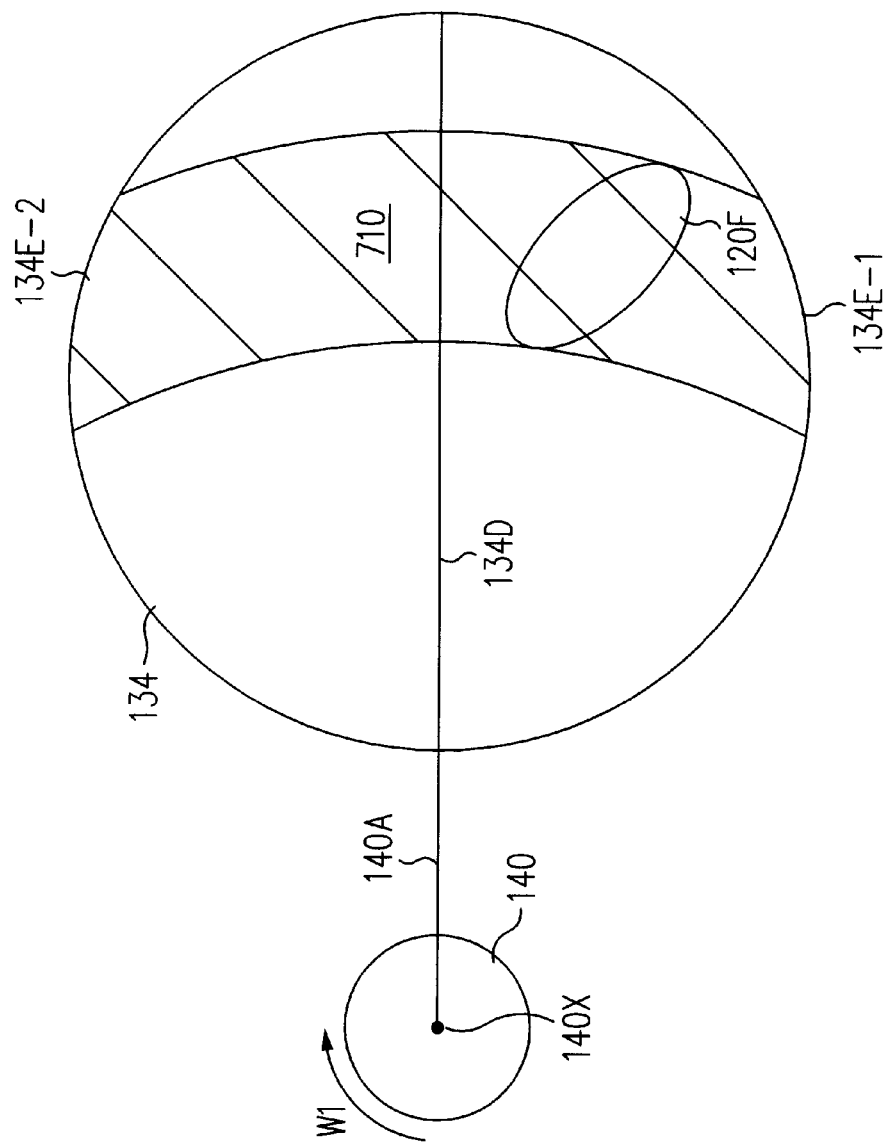
FIG. 7 is a top view illustrating different positions of a wafer relative to the plasma in the system of FIG. 1.

In some embodiments, the direction of the W1 rotation (the rotation of drive 140) is changed during processing to achieve greater uniformity. The reason is, at high pressures (for example, atmospheric pressure) the plasma can be unstable when the wafer enters the plasma. Therefore, the wafer points at which the wafer enters the plasma are processed at a lower rate than the rest of the wafer. In FIG. 7, for example, the W1 rotation is clockwise. The path of plasma footprint 120F on wafer 134 is shown by hatching at 710. The wafer enters the plasma at the wafer edge portion 134E-1, and exits the plasma at edge portion 134E-2. The area adjacent to edge portion 134E-1 is processed at a lower rate. As the wafer rotates around axis 150X, the wafer portion near the edge below the diameter 134D is processed at a lower rate.

Therefore, in some embodiments, the direction of the W1 rotation is changed during processing. For example, in half of the W2 revolutions (around axis 150X) the W1 revolutions are in one direction ("positive" direction), and in the other half of the W2 revolutions the W1 revolutions are in the opposite ("negative") direction. This can be done in etches, depositions, and any other semiconductor and non-semiconductor processes.

In some embodiments, the processing is divided into several stages. For example, in etches of semiconductor wafers, as the wafer becomes thinner, it heats up faster. Therefore, several stages are used. Different stages may have different processing parameters such as velocities and cooling times (the times the wafer spends at Θ=0 for example). In each processing stage, the processing parameters (velocities, etc.) are the same. Each processing stage is sub-divided into two sub-stages. In the first sub-stage, the W1 revolutions are in one direction, and in the second sub-stage, the W1 revolutions are in the other direction. For example, the first stage may include four hundred W2 revolutions. In the first two hundred W2 revolutions, the W1 rotation is in the positive direction; in the next two hundred W2 revolutions, the W1 rotation is in the negative direction. This is repeated in the subsequent stages. The whole process may include thousands of the W2 revolutions, depending on the etching speed and the amount of the material to be removed.

In some embodiments, the direction of the W2 rotation also changes during processing. Thus, some embodiments use any two or more of the four combinations of the W1 and W2 rotations shown in the following table 1:

TABLE 1

| Direction of W1 Rotation | Direction of W2 Rotation |
|---|---|
| positive | positive |
| positive | negative |
| negative | positive |
| negative | negative |

Figure 8:
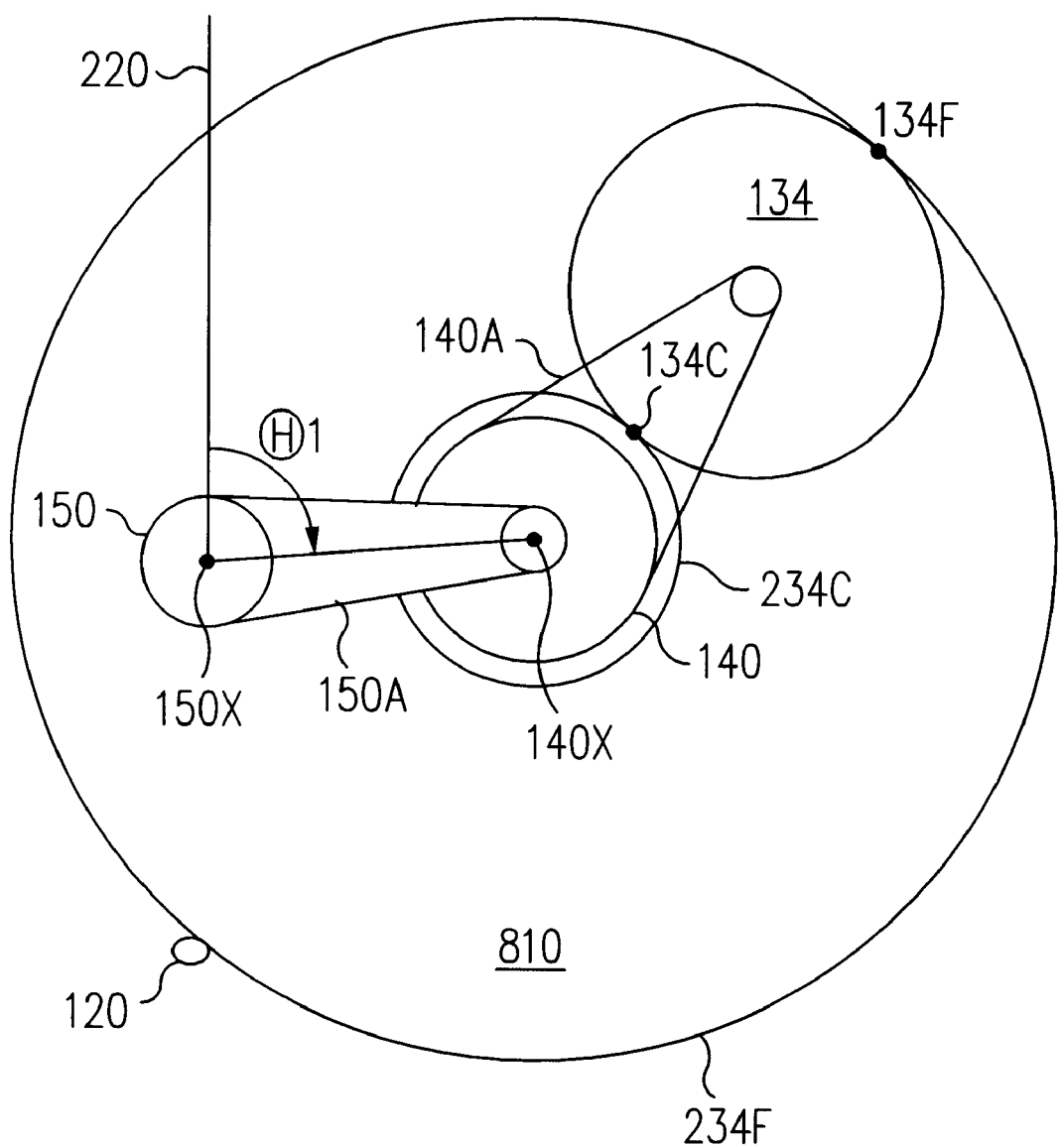
FIGS. 8–12 are top views illustrating different wafer trajectories in the system of FIG. 1.

In some embodiments, to improve uniformity, the articles are processed only during one half of each W2 revolution. The reasons for this will now be explained with reference to FIGS. 8–15. As shown in FIG. 8, wafers 134 sweep a ring-shaped (donut-shaped) area 810 20 bounded by circles 234C and 234F. In FIG. 8, the outer edge 234F of ring 810 enters the plasma 120, and plasma processing begins. The corresponding angle Θ is shown as Θ1. No plasma processing takes place when Θ is between 0° and the value Θ1.

Figure 9:
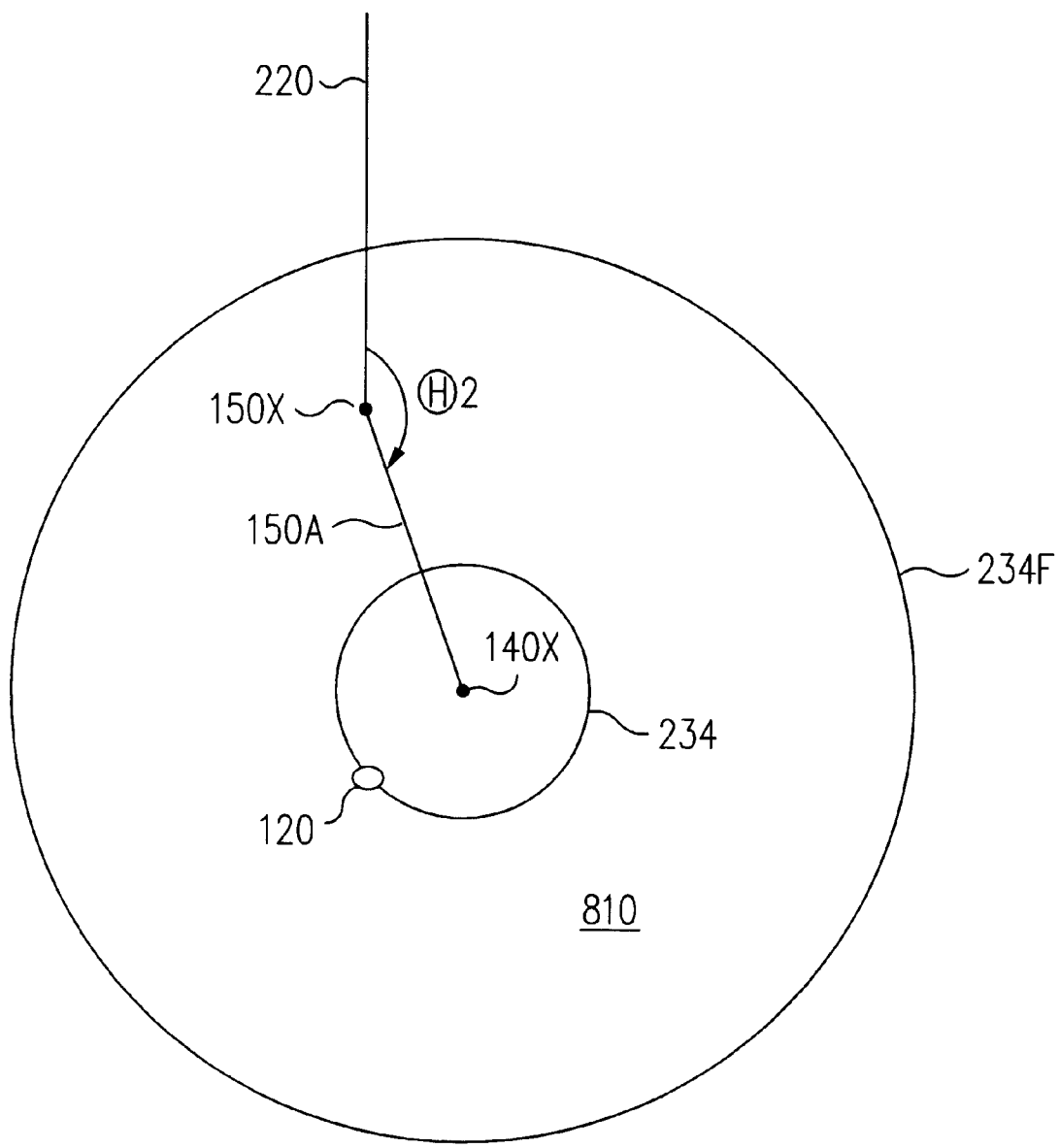
Figure 10:
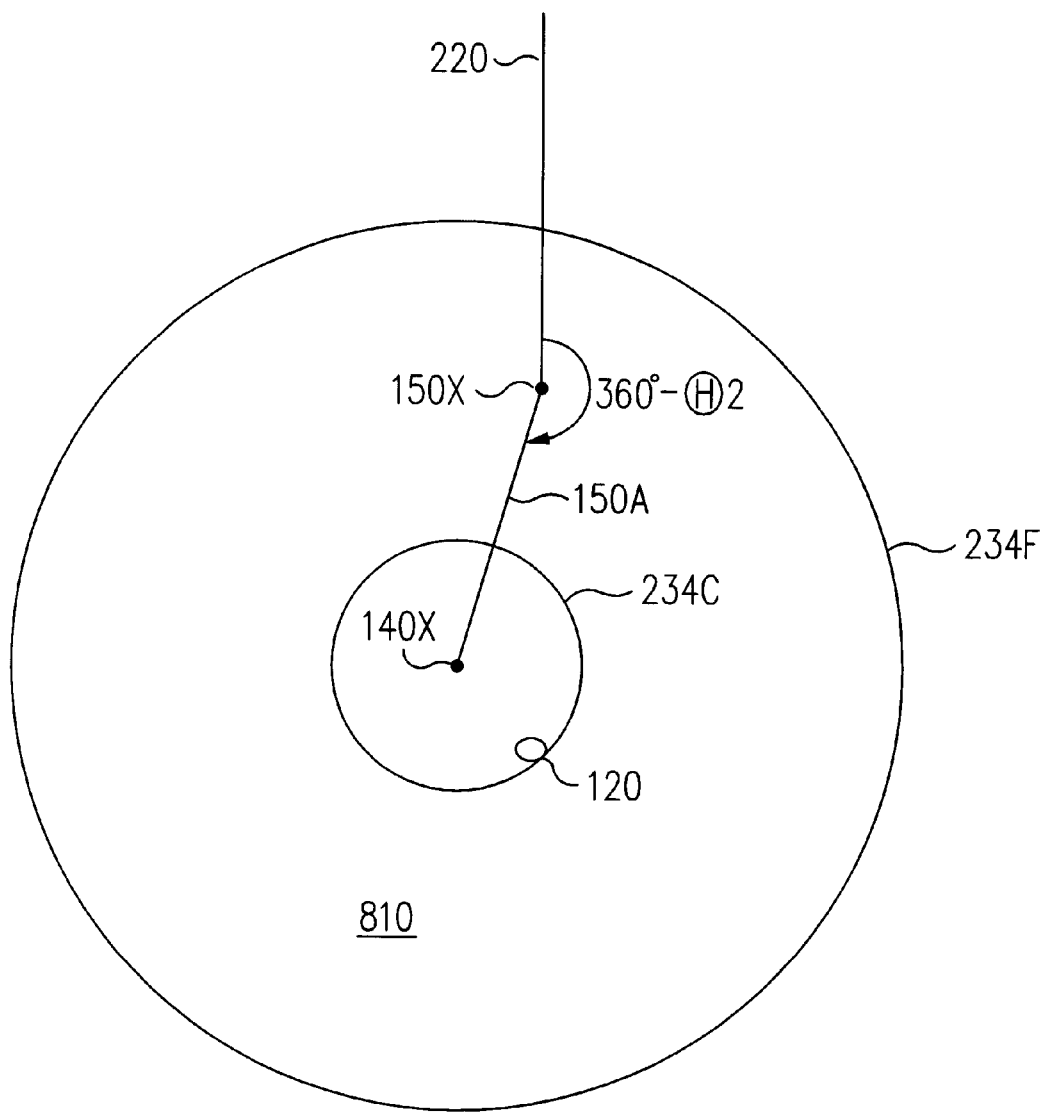

In FIG. 9, the inner edge 234C of ring 810 is leaving plasma 120, and the plasma processing stops since the wafers do not intersect the plasma. The corresponding value of Θ is denoted Θ2.

Then Θ reaches the value of 360°−Θ2 (FIG. 10) as the ring 810 reaches a position symmetric to that of FIG. 9 relative to vertical axis 220. The ring inner edge 234C re-enters the plasma 120, and the plasma processing resumes.

Figure 11:
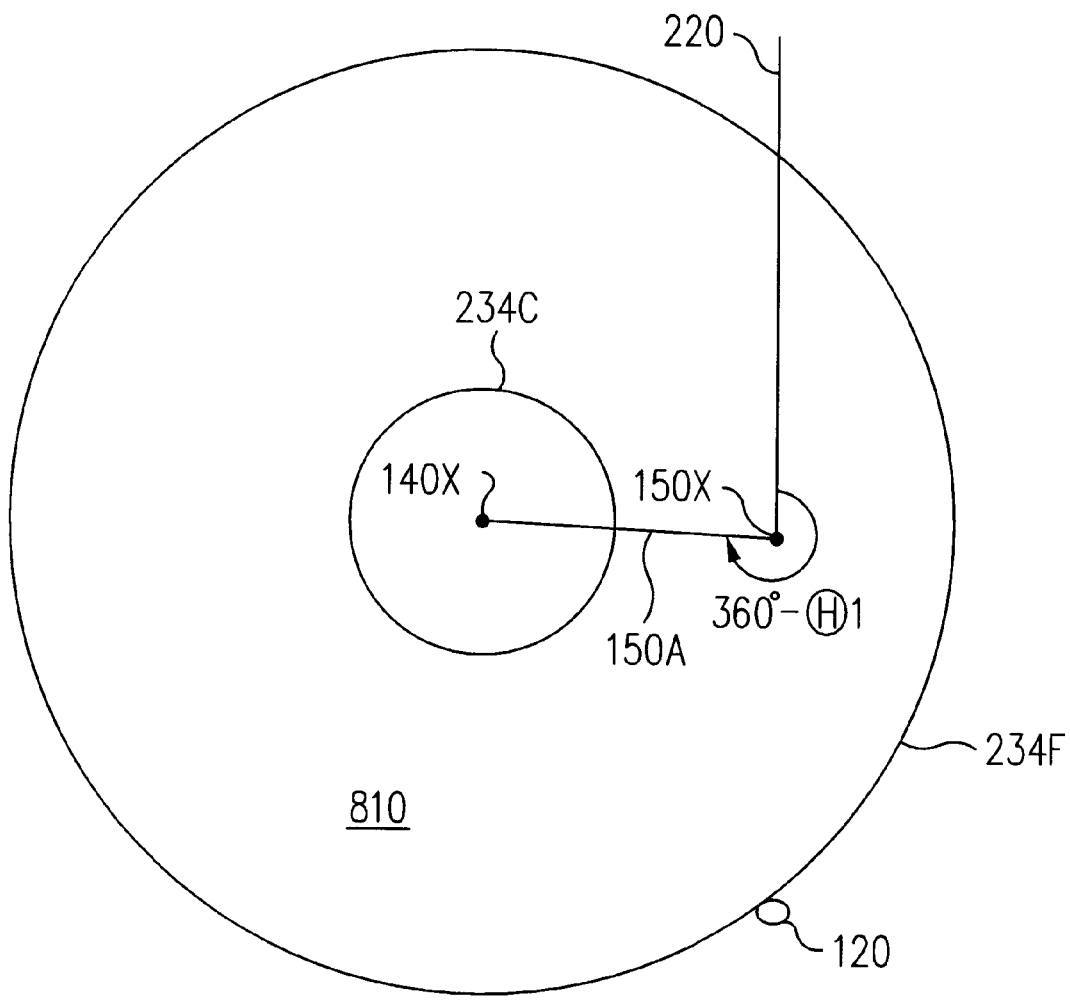
Figure 12:
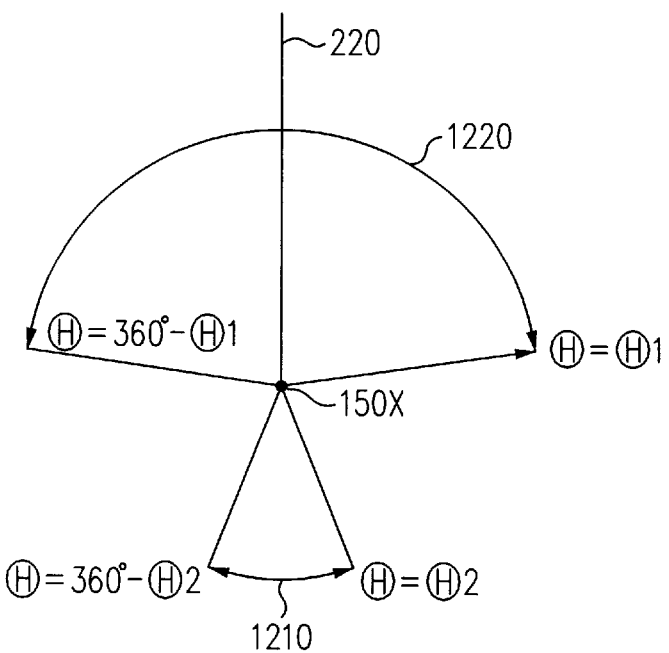
Figure 13:
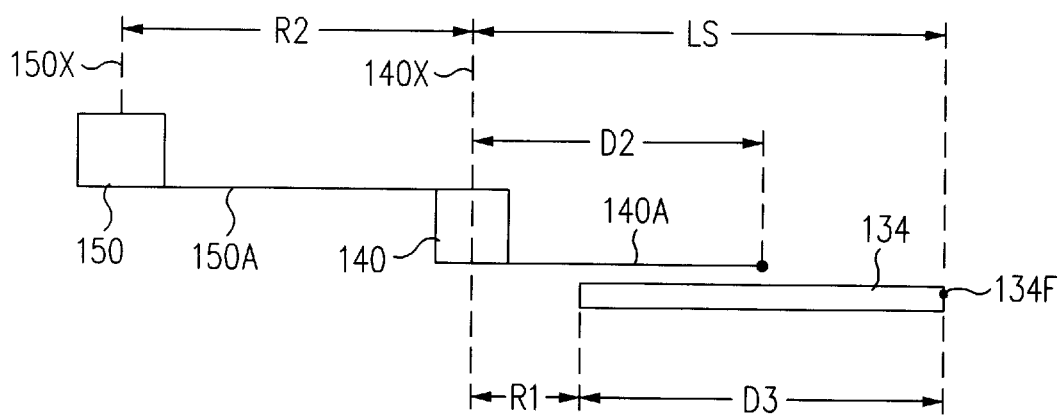
FIG. 13 illustrates wafer and carousel dimensions in the system of FIG. 1.

In FIG. 11, Θ=360°−Θ1. Outer edge 234F is leaving plasma 120, and the plasma processing stops again until the ring 810 re-enters the plasma as in FIG. 8.

Thus, each revolution of drive 150 includes two idle periods 1210, 1220 (FIG. 12) in which no plasma processing takes place. The idle period 1210 is between Θ=Θ2 and Θ=360°−Θ2. The idle period 1220 is between Θ=360°−Θ1 and Θ=Θ1 of the next revolution. The values Θ1 and Θ2, and hence the lengths of idle periods 1210, 1220, depend on the length R2 of arm 150A (FIG. 13), the length D2 of arm 140A, and the diameter D3 of wafer 134. In some embodiments, the lengths R2 and D2 are chosen to accommodate a variety of wafer sizes in the same carousel. Thus, in some embodiments, R2=175 mm, and D2=200 mm. D3 ranges from 4 inches to 8 inches, that is, from about 100 mm to about 200 mm. With such dimensions, the angular length of idle path 1220 is significantly larger than the length of path 1210.

In other embodiments, the dimension D2 is increased to accommodate larger wafers (for example, over 300 mm diameter). Increasing the length D2 also allows more wafers to be placed on the carousel, increasing the throughput. In many cases, path 1220 is longer than path 1210.

This leads to processing non-uniformity. At the beginning of path 1210 (Θ=Θ2) the plasma has just processed the inner edge 234C (i.e. 134C) of the wafers. At the end of path 1210 (Θ=360°−Θ2), the inner edge 234C re-enters the plasma. Thus, the path 1210 represents the time that the inner edge 234C is allowed to cool before being re-processed. Similarly, path 1220 represents the time that the outer edge 234F is allowed to cool before being re-processed. If the path 1220 is longer, the outer edge cools more, and hence is processed at a slower rate.

To even out the processing rates, in some embodiments the W2 rotation (the rotation of drive 150) is slowed down in path 1210 to allow the inner edge 234C to cool more. However, in path 1210, some portions of the carousel (including the arms 140A and, perhaps, the drive 140) are exposed to the plasma. Therefore, the carousel lifetime is reduced by the heat and active chemicals carried by the plasma.

Figure 14:
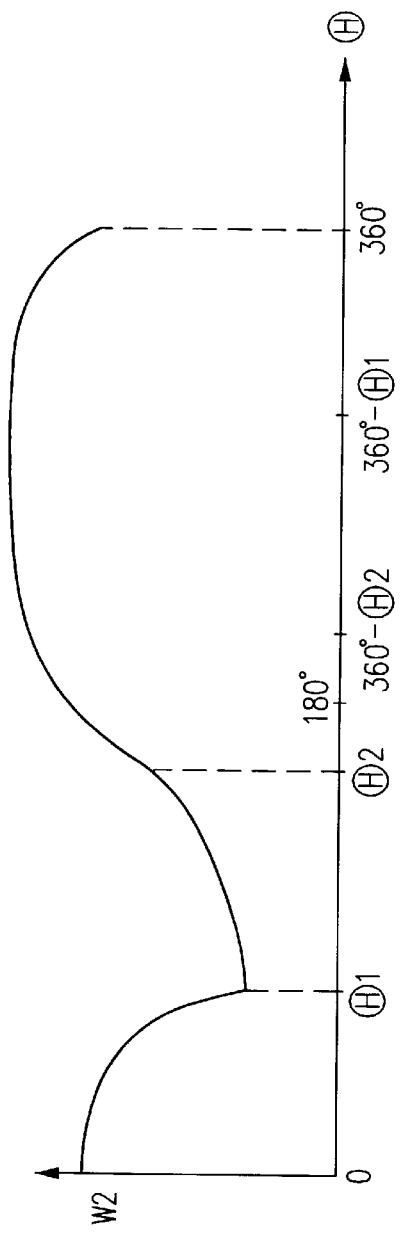
FIGS. 14 and 15 show velocity graphs for the system of FIG. 1.

In other embodiments, the W2 revolutions are accelerated sharply at Θ=Θ2 (FIG. 14). The linear velocity of the wafers increases, for example, by 100–150%, and then sharply returns to 0 or some other suitable value (as needed for cooling) when Θ is near 360°. Thus, the wafer processing is substantially prevented when Θ is between 180° and 360°. Consequently, the cooling is more uniform, and the processing uniformity is increased.

Figure 15:
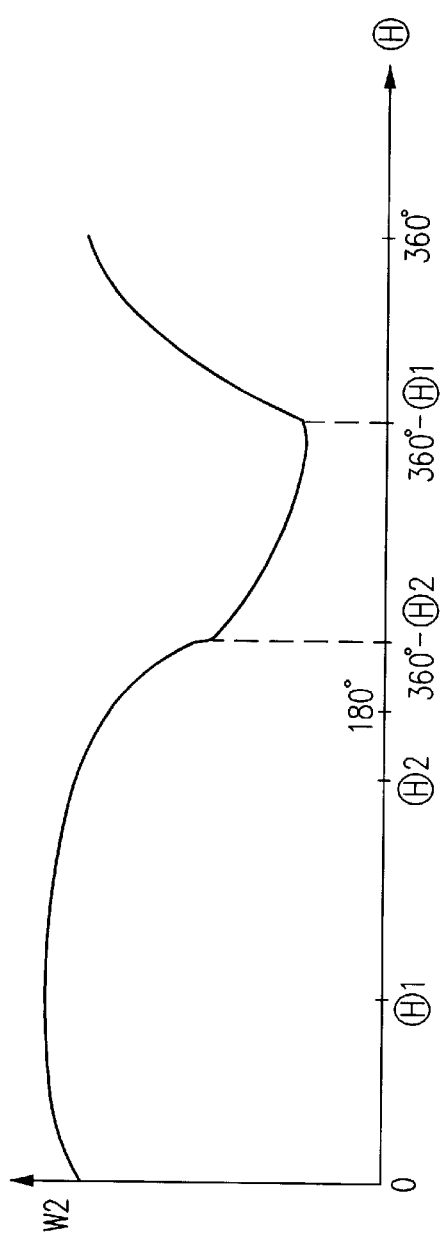

In FIG. 15, the angular velocity W2 is increased for Θ between 0 and 180° to prevent wafer processing. The wafer is processed between 180° and 360°.

The above embodiments illustrate but do not limit the invention. The invention is not limited to any particular shape or size of opening 114-O or plasma footprint 120F. In some embodiments, the shape and dimensions of opening 114-O vary during processing. In some embodiments, the velocity W1 varies during processing. In some embodiments, drive 140 is omitted. Plasma source 114 moves radially along a rotation radius of drive 150, and the opening 114-O rotates at the same time so that the plasma footprint 120F moves relative to the wafer as shown in FIG. 5. Some embodiments process articles other than semiconductor dies or wafers, for example, surgical instruments or machine tools. Other embodiments and variations are within the scope of the invention as defined by the appended claims.

Appendix $W2(t) = \partial\Theta/\partial t$ $$\int_0^T W2(t)\,dt = 2\pi$$

$$P(r1) = (1/2) * \pi * r1 * \int_0^T \int_0^{2\pi} p(\rho(\beta), \varphi(t, \beta))\,dt\,d\beta,$$

$R1 \leq r1 \leq LS$ $\rho(\beta) = (R2^2 + r1^2 - 2*R2*r1*\cos(\beta))^{1/2}$ $\phi(t,\beta) = \Theta(t) + \cos^{-1}((R2^2 + \rho^2(\beta) - r1^2)/(2*R2*\rho(\beta)))$ where:
- t is time; T is the duration of one revolution of second drive 150;
- P(r1) is the desired process result on the surface of the wafer 134 along the radius r1 of the first drive 140;
- p(ρ(β),φ(t,β)) is the distribution of the plasma treatment intensity within the plasma footprint 120F at the surface of wafer 134 at a point having polar coordinates (ρ,φ) in the polar coordinate system having an origin on the axis 150X;
- β is the angular position of the arm 140A relative to any predetermined direction in the plane of wafer 130 (i.e. perpendicular to rotation axes 140X, 150X).

What is claimed is:

1. A method for processing an article with plasma, the method comprising:
   generating plasma; and
   moving the article through the plasma;
   wherein in a first period of time, the article motion through the plasma includes a rotational motion around a first axis in a first direction; and
   in a second period of time, the article motion through the plasma includes a rotational motion around the first axis in a second direction opposite from the first direction;
   wherein the rotational motion around the first axis in the first and second periods of time includes rotating the article around the first axis as the first axis rotates around a second axis;
   wherein in the first period of time, as the article rotates around the first axis in the first direction, the first axis rotates around the second axis in a third direction, and in the second period of time, as the article rotates around the first axis in the second direction, the first axis rotates around the second axis in a fourth direction opposite from the third direction.

2. The method of claim 1 wherein the first and second axes do not intersect the article.

3. A method for processing an article with plasma, the method comprising:
   generating plasma; and
   moving the article through the plasma;
   wherein in a first period of time, the article motion through the plasma includes a rotational motion around a first axis in a first direction; and
   in a second period of time, the article motion through the plasma includes a rotational motion around the first axis in a second direction opposite from the first direction;
   wherein the rotational motion around the first axis in the first and second periods of time includes rotating the article around the first axis as the first axis rotates around a second axis;
   wherein in the first period of time, as the article rotates around the first axis in the first direction, the first axis rotates around the second axis in a third direction, and in the second period of time, as the article rotates around the first axis in the second direction, the first axis rotates around the second axis in the third direction;
   wherein during the rotational motion in the first direction, the article enters the plasma at a first edge portion of the article and exits the plasma at a second edge portion of the article; and
   during the rotational motion in the second direction, the article enters the plasma at the second edge portion and exits the plasma at the first edge portion.

4. A method for processing an article with plasma, the method comprising:
   generating plasma;
   rotating an article around a first axis, and rotating the first axis around a second axis, so that the article gets processed with the plasma;
   wherein during one half of each revolution of the article around the second axis, the article is processed with the plasma, and during the other half of each revolution around the second axis, processing of the article with the plasma is substantially prevented.

5. The method of claim 4 wherein the processing of the article with the plasma is substantially prevented by increasing the velocity of the article while moving the article through the plasma.

6. The method of claim 4 wherein the article is a semiconductor wafer.

7. A method for processing an article with plasma, the method comprising:
   generating plasma; and
   moving the article through the plasma;
   wherein the article motion through the plasma includes a first rotational motion of the article around a first axis as the first axis performs a second rotational motion around a second axis;
   wherein at least one of the first and second rotational motions changes direction during the processing; and
   wherein the first axis does not intersect the article.

8. The method of claim 7 wherein the plasma processing takes place at atmospheric pressure.

9. The method of claim 7 wherein the article is a semiconductor wafer.

10. A method for processing an article with plasma, the method comprising:
    generating plasma; and
    moving the article through the plasma;
    wherein the article motion through the plasma includes a first rotational motion of the article around a first axis as the first axis performs a second rotational motion around a second axis; and
    wherein at least one of the first and second rotational motions changes direction during the processing;
    wherein a plasma footprint on the article is smaller than an article surface processed with the plasma.

11. A method for processing an article with plasma, the method comprising:
    generating plasma; and
    moving the article through the plasma;
    wherein the article motion through the plasma includes a first rotational motion of the article around a first axis as the first axis performs a second rotational motion around a second axis; and
    wherein at least one of the first and second rotational motions changes direction during the processing;
    wherein the rotation of the first axis around the second axis alternates between a first direction and a second direction opposite from the first direction, such that in a first period of time, the first axis rotates around the second axis in the first direction as the article rotates around the first axis in a third direction, and in a second period of time, the first axis rotates around the second axis in the second direction as the article rotates around the first axis in the third direction.

* * * * *